(12) United States Patent
Murakami et al.

(10) Patent No.: US 6,770,915 B2
(45) Date of Patent: Aug. 3, 2004

(54) LIGHT EMITTING ELEMENT WITH MULTIPLE MULTI-LAYER REFLECTORS AND A BARRIER LAYERS

(75) Inventors: Tetsuroh Murakami, Tenri (JP); Takahisa Kurahashi, Kashiba (JP); Shouichi Ohyama, Ikoma-gun (JP); Hiroshi Nakatsu, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 103 days.

(21) Appl. No.: 10/417,193

(22) Filed: Apr. 17, 2003

(65) Prior Publication Data

US 2003/0197171 A1 Oct. 23, 2003

(30) Foreign Application Priority Data

Apr. 17, 2002 (JP) ........................................ 2002-115114

(51) Int. Cl.[7] .............................................. H01L 33/00
(52) U.S. Cl. ............................ 257/98; 257/79; 257/88; 257/228; 257/257
(58) Field of Search ................................ 257/228, 257, 257/88, 79, 98

(56) References Cited

U.S. PATENT DOCUMENTS

2002/0028526 A1    3/2002   Kurahashi et al.

FOREIGN PATENT DOCUMENTS

| JP | 2001-068727 | 3/2001 |
| JP | 2001-068732 | 3/2001 |
| JP | 2002-076433 | 3/2002 |

OTHER PUBLICATIONS

Streubel et al. "High Brightness Visible (660 nm) Resonant–Cavity Light–Emitting Diode" IEEE Photonics Technology Letters, vol. 10, No. 12, Dec. 1998, pp. 1685–1687.
Nakahara et al. "Long–Wavelength Semiconductor Laser Array for Parallel Optical Interconnection" O Plus E., vol. 21, No. 2, Feb. 1999, pp. 168–172.
U.S. patent application Ser. No. 09/607,965 filed Jun. 30, 2000.
U.S. patent application Ser. No. 09/645571.

*Primary Examiner*—Fetsum Abraham
(74) *Attorney, Agent, or Firm*—Morrison & Foerster LLP

(57) ABSTRACT

In a semiconductor light-emitting element, a first DBR and a second DBR, with a specified spacing left between them, form a resonator, and a single quantum well active layer is positioned at the loop of a standing wave within this resonator. The single quantum well active layer is composed of a $Ga_{0.5}In_{0.5}P$ well layer and a pair of $(Al_{0.5}Ga_{0.5})_{0.5}In_{0.5}P$ barrier layers, which sandwiches the $Ga_{0.5}In_{0.5}P$ well layer therebetween. The impurity concentration of the $(Al_{0.5}Ga_{0.5})_{0.5}In_{0.5}P$ barrier layers is higher than that of the $Ga_{0.5}In_{0.5}P$ well layer. For example, the impurity concentration of the $Ga_{0.5}In_{0.5}P$ well layer is set to $2\times10^{16}$ cm$^{-3}$, while the impurity concentration of the $(Al_{0.5}Ga_{0.5})_{0.5}In_{0.5}P$ barrier layers is set to $2\times10^{18}$ cm$^{-3}$.

11 Claims, 9 Drawing Sheets

LIGHT EMITTING ELEMENT WITH MULTIPLE MULTI-LAYER REFLECTORS AND A BARRIER LAYERS

BACKGROUND OF THE INVENTION

The present invention relates to semiconductor light-emitting elements such as, for example, ones suitable for transmission and display use.

In recent years, semiconductor light-emitting elements have been prevalently used for optical communication as well as information display panels. It is essential for these semiconductor light-emitting elements to have high light-emitting efficiency. It is further essential for semiconductor light-emitting elements for optical communication to have a high response speed, and they have recently been extensively developed.

A conventional surface-emitting type LED (light-emitting diode) is not so favorable in high-speed responsiveness, and around 150–200 Mbps is its limit. Thus, a semiconductor light-emitting element called "resonant cavity type LED" has been developed. This resonant cavity-type LED is a semiconductor light-emitting element that controls spontaneous light emission by positioning a light-emitting layer at the loop of a standing wave that is generated within a cavity formed by two mirrors, to thereby realize high-speed response and high efficiency [see JP-A-3-229480, and U.S. Pat. No. 5,226,053].

Particularly, POFs (plastic optical fibers) have recently started to be utilized for high-speed communication that copes with a standard such as IEEE1394 or USB2, and a resonant cavity-type LED has been developed that uses, as a light-emitting layer, an AlGaInP type semiconductor material, which is enabled to emit light with high efficiency at a wavelength of 650 nm that is a low-loss waveguide region of the POF [High Brightness Visible (660 nm) Resonant-Cavity Light-Emitting Diode: IEEE PHOTONICS TECHNOLOGY LETTERS, VOL. 10, No. 12, December 1998]. This resonant cavity-type LED has a multi-quantum well structure, and barrier layers and well layers in the multi-quantum well structure were non-doped. That is, in the multi-quantum well structure, the barrier layers and the well layers had the same impurity concentration. This enables the resonant cavity-type LED to achieve a rise/fall time of about 3 ns, but a further improvement in the rise/fall time is requested because of the necessity of high-speed communication. For example, in order to accommodate to the standard of IEEE 1394S-200, it is required that the rise/fall time be not more than 1.6 ns.

SUMMARY OF THE INVENTION

It is an object of the present invention to provide a semiconductor light-emitting element superior in high-speed responsiveness.

In order to achieve the above object, in a semiconductor light-emitting element of the present invention, a first multi-layer reflective film, a quantum well light-emitting layer, and a second multi-layer reflective film are stacked on a semiconductor substrate in this order. The first and the second multi-layer reflective film, with a specified spacing between them, form a resonator within which a standing wave is generated, and the quantum well light-emitting layer is positioned at a loop of the standing wave within this resonator. The quantum well light-emitting layer has at least one well layer and barrier layers that sandwich the at least one well layer therebetween. The barrier layers have an impurity concentration higher than an impurity concentration of the well layer.

Through this specification, composition ratios y and z are independent between compound semiconductors.

According to the semiconductor light-emitting element with the above constitution, since the impurity concentration of the barrier layers is higher than that of the well layer, injected carriers are easily recombined in the barrier layers. This facilitates annihilation of injected carriers when a response signal is off. Thereby, when performing optical communication, for example, the fall time when a response signal is turned off becomes shorter. Accordingly, the response speed can be improved.

As described later, if the impurity concentration of the barrier layers is not more than a certain level, the optical output characteristics are not affected adversely.

In one embodiment, the impurity concentration of the barrier layers is set to $2 \times 10^{18}$ cm$^{-3}$ or more, whereby impurities that are to form the nonluminous recombination center increase. As a result, recombination of injected carriers is facilitated, thus making it possible to improve the response speed.

By setting the impurity concentration to $1 \times 10^{19}$ cm$^{-3}$ or less, diffusion of impurities to the well layer is prevented, thus making it possible to prevent a fall in the optical output due to the diffusion of impurities.

In one embodiment, the impurity concentration of the barrier layers is set to $5 \times 10^{18}$ cm$^{-3}$ or more, whereby impurities that are to form the nonluminous recombination center extremely increase. As a result, recombination of injected carriers is facilitated more, and the response speed can further be improved.

In one embodiment, the impurity concentration is in the well layer is $5 \times 10^{17}$ cm$^{-3}$ or less, so that an optical output can be increased without lowering light-emitting efficiency of the well layer, different from the case where high-concentration impurities are used for the well layer.

The impurity concentration of the well layer may be zero.

In one embodiment, the quantum well light-emitting layer is preferably composed of $Al_y Ga_z In_{1-y-z} P$ ($0 \leq y \leq 1$, $0 \leq z \leq 1$).

In this case, light emission at a wavelength of about 550 nm to 680 nm can be achieved by the quantum well light-emitting layer.

In one embodiment, the second multi-layer reflective film is preferably composed of $Al_y Ga_z In_{1-y-z} P$ ($0 \leq y \leq 1$, $0 \leq z \leq 1$).

In this case, the second multi-layer reflective film becomes transparent to light emission at a wavelength of about 550 nm or more, thus making it possible to take out light having a wavelength of about 550 nm or more efficiently.

In one embodiment, a current confinement layer is preferably formed on the second multi-layer reflective film.

In this case, the density of a current to be injected to a lower part of the current confinement layer increases, thus making it possible to further improve the response speed.

In accordance with a semiconductor light-emitting element of one embodiment, the current confinement layer is preferably composed of $Al_y Ga_z In_{1-y-z} P$ ($0 \leq y \leq 1$, $0 \leq z \leq 1$).

In this case, the current confinement layer becomes transparent to light emission at a wavelength of about 550 nm or more, thus making it possible to take out light having a wavelength of about 550 nm or more efficiently.

In accordance with a semiconductor light-emitting element of one embodiment, a diffusion layer is preferably formed on the current confinement layer.

In this case, if the current confinement layer is provided with an opening, for example, a current can uniformly be injected into the opening of the current confinement layer, thus making it possible to control the operation voltage at a low level.

In one embodiment, the current diffusion layer is preferably composed of $Al_yGa_zIn_{1-y-z}P$ ($0 \leq y \leq 1$, $0 \leq z \leq 1$).

In this case, the current diffusion layer becomes transparent to light emission at a wavelength of about 550 nm or more, thus making it possible to take out light emission at a wavelength of about 550 nm or more efficiently.

In one embodiment, preferably, the at least one well layer and/or the barrier layers are doped with any one of Si, Zn, Mg and Se.

Si, Zn, Mg and Se can easily be added by various crystal-growing methods.

In one embodiment, the semiconductor substrate is a GaAs substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The semiconductor light-emitting element of the present invention will be described in more detail in accordance with the illustrated embodiments.

(Embodiment 1)

Figure 1A:
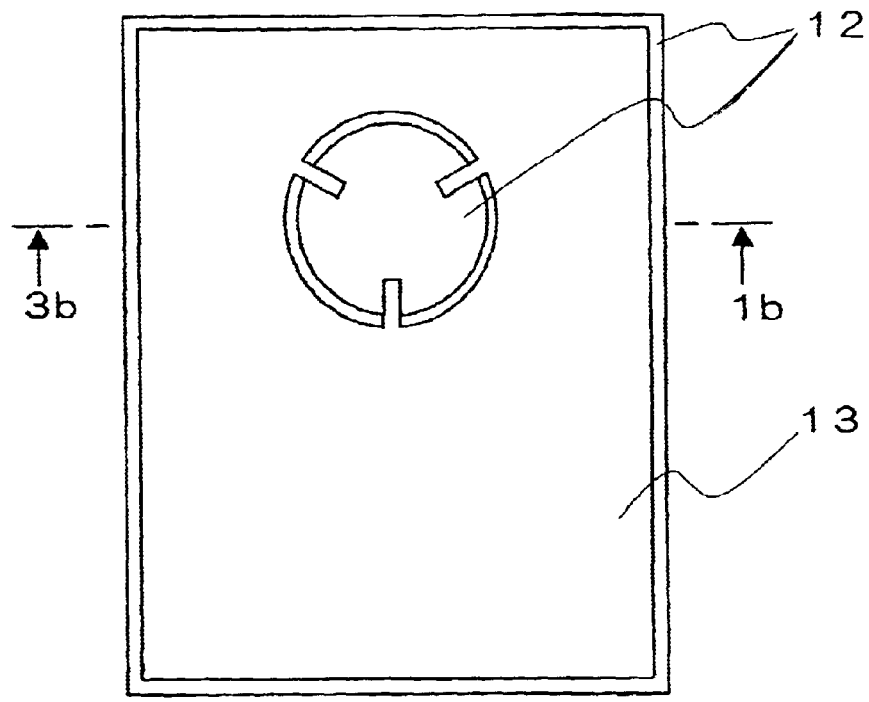
FIG. 1(a) is a top plan view of a semiconductor light-emitting element of Embodiment 1 of the present invention.
Figure 1B:
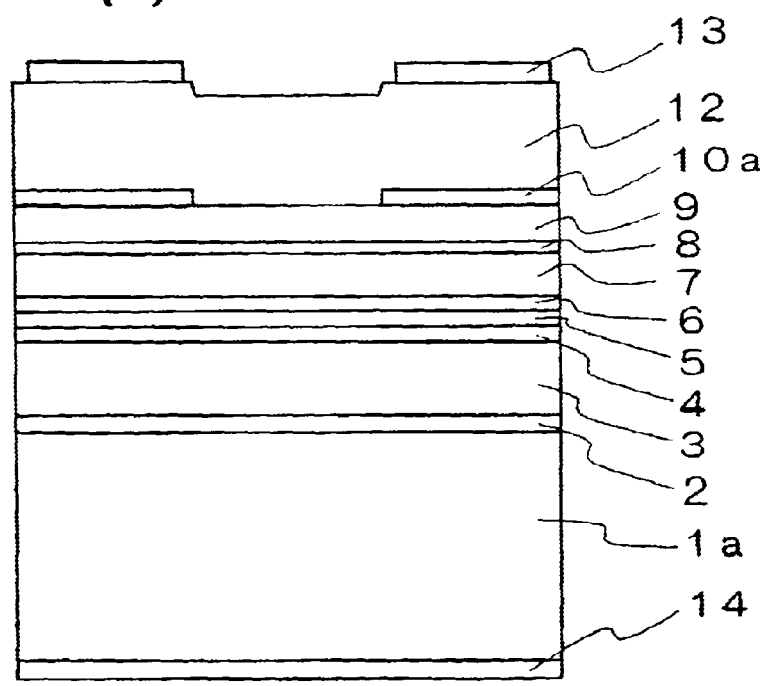
FIG. 1(b) is a cross-sectional view taken along line 1b—1b of FIG. 1(a)
Figure 2:
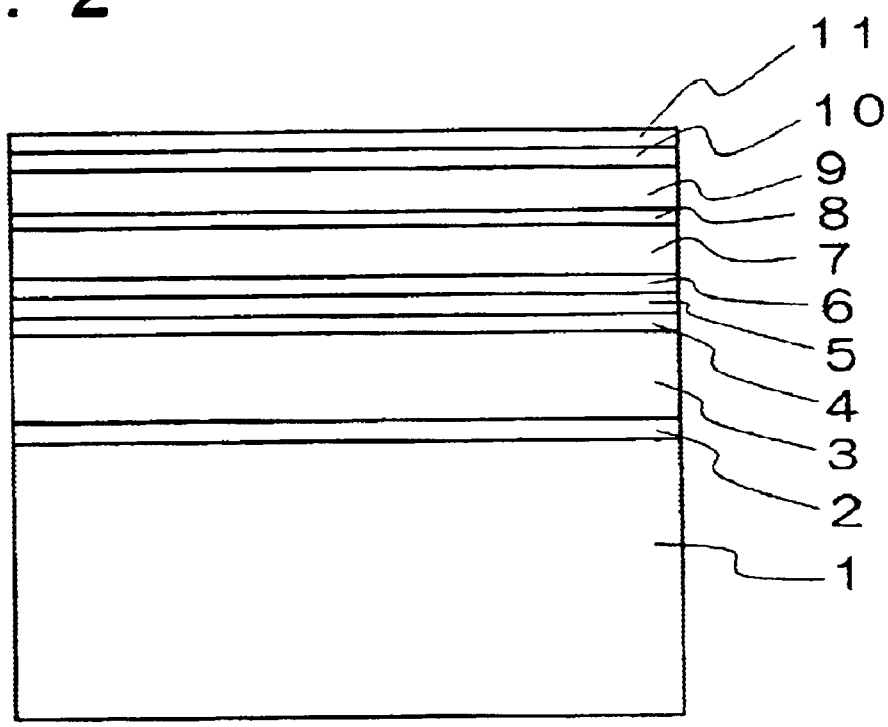
FIG. 2 is a cross-sectional view of the semiconductor light-emitting element of Embodiment 1 in course of production.
Figure 3A:
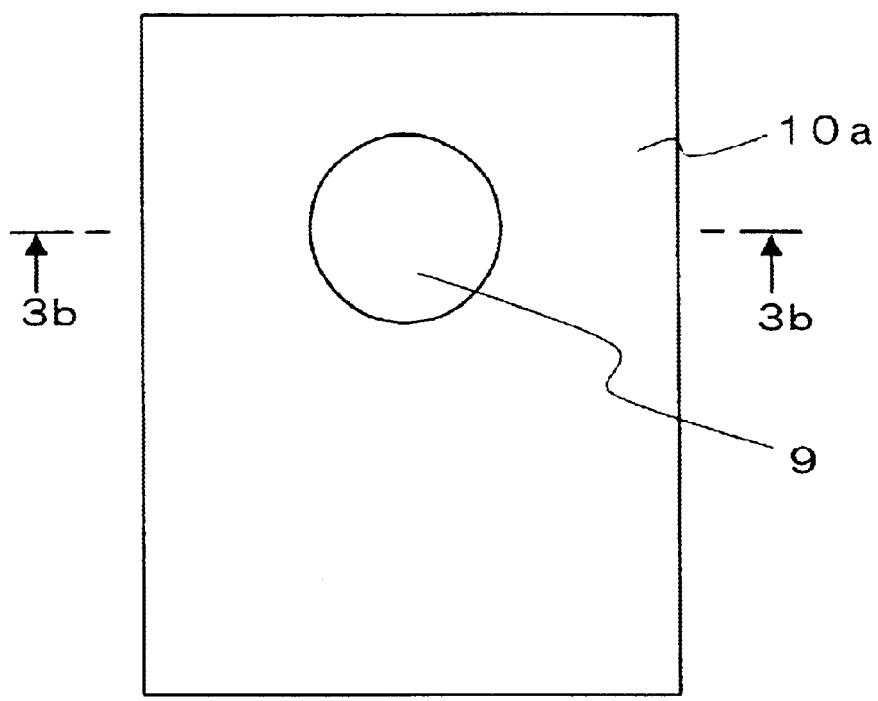
FIG. 3(a) is another top plan view of the semiconductor light-emitting element of Embodiment 1 in course of production.
Figure 3B:
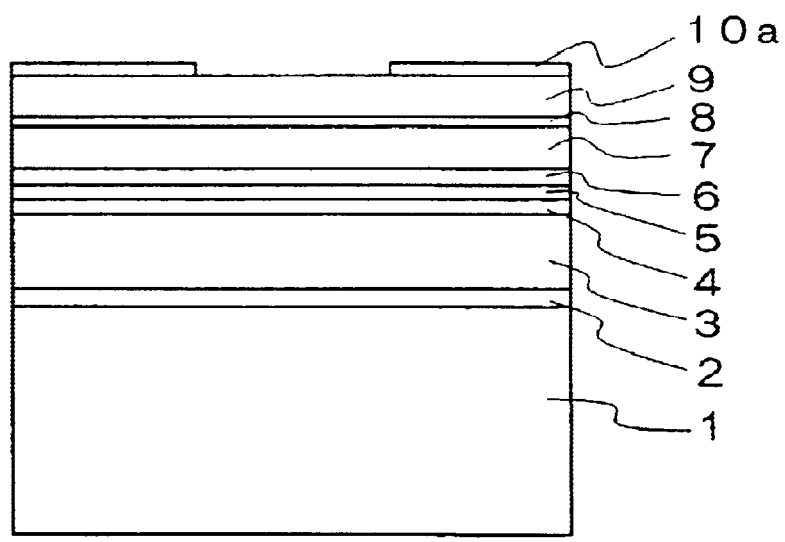
FIG. 3(b) is a cross-sectional view taken along line 3b—3b of FIG. 3(a)

FIG. 1(a) is a top plan view of a resonant cavity-type semiconductor light-emitting element as a semiconductor light-emitting element of Embodiment 1, and FIG. 1(b) is a cross-sectional view taken along line 1b—1b of FIG. 1(a). FIG. 2 is a cross-sectional view of the semiconductor light-emitting element in a production process step. FIG. 3(a) is a top plan view of the semiconductor light-emitting element in another production process step, and FIG. 3(b) is a cross-sectional view taken along line 3b—3b of FIG. 3(a).

The semiconductor light-emitting element of Embodiment 1 is of an AlGaInP type, and is produced in the following manner.

First, as shown in FIG. 2, stacked on an n-type GaAs substrate 1 as one example of the semiconductor substrate are an n-type GaAs buffer layer 2, a first DBR (Distributed Bragg Reflector) film 3 as one example of the first multi-layer reflective film, an n-type $(Al_{0.7}Ga_{0.3})_{0.5}In_{0.5}P$ first cladding layer 4, a single-quantum well active layer 5 as one example of the quantum well light-emitting layer, a p-type $(Al_{0.7}Ga_{0.3})_{0.5}In_{0.5}P$ second cladding layer 6, a second DBR film 7 as one example of the second multi-layer reflective film, a p-type AlGaInP intermediate layer 8, a p-type GaP etching protective layer 9, an n-type GaP current confinement layer 10, and an undoped GaAs cap layer 11, which are sequentially formed by a MOCVD (metal organic chemical vapor deposition) method. The n-type GaAs substrate 1 has a plane orientation inclined at an angle of 15° relative to a (100) plane in a [011] direction. In Embodiment 1, the thicknesses of the n-type GaAs buffer layer 2, the p-type AlGaInP intermediate layer 8, the p-type GaP etching protective layer 9, the n-type GaP current confinement layer 10 and the GaAs cap layer 11 are set to, for example, 1 μm, 0.1 μm, 1 μm, 0.3 μm and 0.01 μm, respectively.

The first DBR film 3 is composed of 30.5 pairs of n-type AlAs and n-type $Al_{0.5}Ga_{0.5}As$, while the second DBR film 7 is composed of 12 pairs of p-type $(Al_{0.2}Ga_{0.8})_{0.5}In_{0.5}P$ and p-type $Al_{0.5}In_{0.5}P$. These first and second DBR films 3, 7 are formed such that the center wavelength of the reflection spectrum is 650 nm. The first DBR film 3 and the second DBR film 7, with a specified space left between them, form a resonator. The length of the resonator is adjusted such that the resonance wavelength is also 650 nm. In Embodiment 1, the length of the resonator is set to twice the wavelength. Furthermore, the single quantum well active layer 5 is positioned at the loop of a standing wave generated within the resonator formed by the first and second DBR films 3 and 7. Also, the light-emitting peak wavelength of the single quantum well active layer 5 is set to 650 nm.

Figure 4:
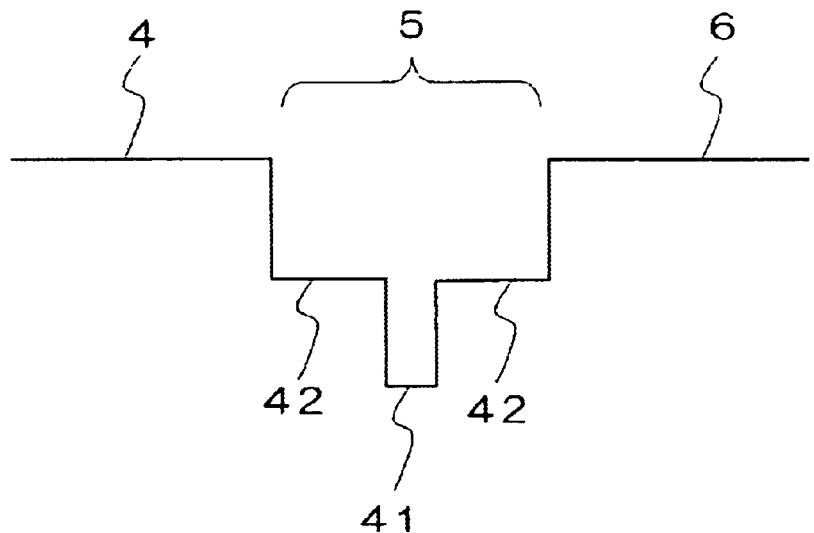
FIG. 4 is a view showing the bandgaps of a single quantum well active layer of the semiconductor light-emitting element of Embodiment 1.

The bandgaps present between the n-type $(Al_{0.7}Ga_{0.3})_{0.5}In_{0.5}P$ first cladding layer 4 and the p-type $(Al_{0.7}Ga_{0.3})_{0.5}In_{0.5}P$ second cladding layer 6 is shown in FIG. 4. In FIG. 4, the bandgap energy is higher in an upper part than in a lower part of the figure.

The single quantum well active layer 5 is composed of a $Ga_{0.5}In_{0.5}P$ well layer 41 and a pair of $(Al_{0.5}Ga_{0.5})_{0.5}In_{0.5}P$ barrier layers 42, 42 between which the $Ga_{0.5}In_{0.5}P$ well layer 41 is disposed. The $Ga_{0.5}In_{0.5}P$ well layer 41 is undoped, has a thickness of 100 Å and an impurity concentration of $2 \times 10^{16}$ cm$^{-3}$, for example. The $(Al_{0.5}Ga_{0.5})_{0.5}$ $In_{0.5}P$ barrier layers 42, 42 are Si-doped, have a thickness of 200 Å and an impurity concentration of $2\times10^{18}$ cm$^{-3}$, for example.

Next, the GaAs cap layer 11 shown in FIG. 2 is removed by a sulfuric acid/hydrogen peroxide type etchant, and then a part of the n-type GaP current confinement layer 10 is etched by photolithography and the sulfuric acid/hydrogen peroxide type etchant until the p-type GaP etching protective layer 9 is reached. As a result, an n-type GaP current confinement layer 10a is achieved on the p-type GaP etching protective layer 9, as shown in FIG. 3(a) and FIG. 3(b). This GaP current confinement layer 10a is formed with a circular-shaped through hole having a diameter of 70 μm, and a substance which the through hole is filled with becomes a part of a current path.

Next, as shown in FIG. 1(a) and FIG. 1(b), a p-type AlGaInP current diffusion layer 12 having a thickness of, for example, 7 μm is formed on the GaP etching protective layer 9 and the n-type GaP current confinement layer 10a. After that, AuBe/Au is deposited on the p-type AlGaInP current diffusion layer 12, which is processed by photolithography and an Au etchant to form a surface electrode. Thermal treatment of the surface electrode results in a p-type electrode 13 on the p-type AlGaInP current diffusion layer 12. Then, the n-type GaAs substrate 1 is polished from the side opposite from the side that faces the n-type GaAs buffer layer 2 to obtain an about 280-μm thick GaAs substrate 1a. AuGe/Au is deposited on the polished surface of this GaAs substrate 1a, namely on the surface of the lower side of the GaAs substrate 1a in FIG. 1(b), and then thermally treated to form an n-type electrode 14.

In the semiconductor light-emitting element fabricated in this manner, because the impurity concentration of the $(Al_{0.5}Ga_{0.5})_{0.5}In_{0.5}P$ barrier layers 42 is higher than that of the $Ga_{0.5}In_{0.5}P$ well layer 41, injected carriers are easily recombined in the $(Al_{0.5}Ga_{0.5})_{0.5}In_{0.5}P$ barrier layers 42. This facilitates annihilation of carriers when the response signal is off. As a result, the fall speed becomes as fast as 1.6 ns.

In the case where barrier layers having an impurity concentration of $8\times10^{17}$ cm$^{-3}$ are used in place of the $(Al_{0.5}Ga_{0.5})_{0.5}In_{0.5}P$ barrier layers 42 having an impurity concentration of $2\times10^{18}$ cm$^{-3}$, the fall time is 2.6 ns.

Figure 5:
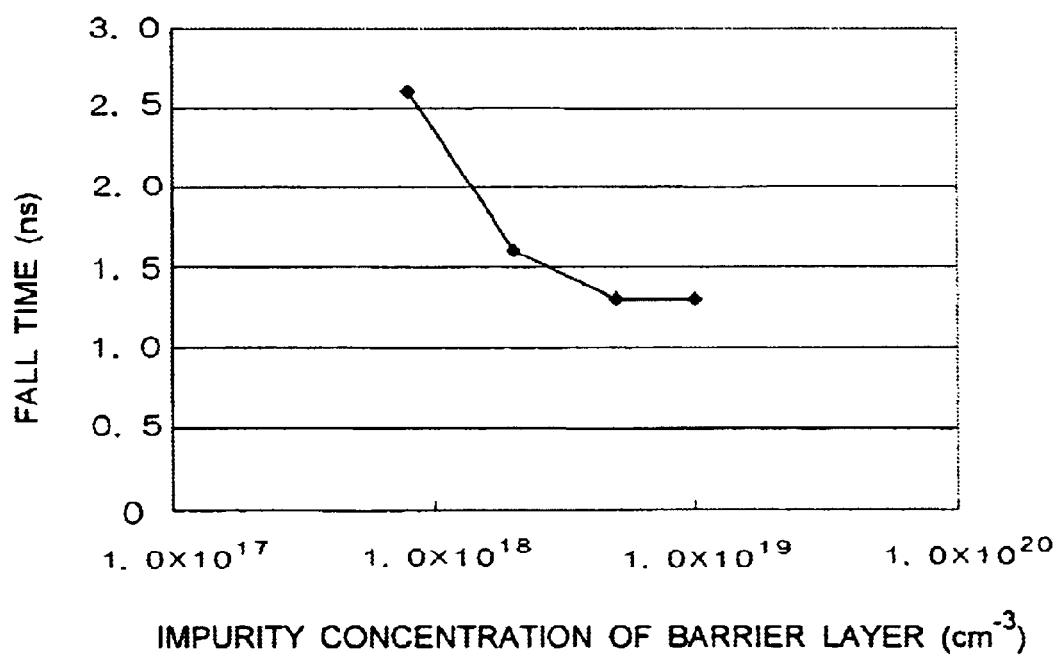
FIG. 5 is a graph showing the relationship between the impurity concentration of barrier layers and the fall time.

FIG. 5 shows a graph in which the relationship between the impurity concentration of the barrier layers of the quantum well active layer and the fall time is plotted.

According to FIG. 5, when the impurity concentration of the barrier layers is set to $8.0\times10^{17}$ cm$^{-3}$, the fall time is 2.6 ns. When the impurity concentration of the barrier layers are set to $2.0\times10^{18}$ cm$^{-3}$, the fall time is 1.6 ns. When the impurity concentration of the barrier layers is set to $5.0\times10^{18}$ cm$^{-3}$, the fall time is 1.3 ns. When the impurity concentration of the barrier layers is set to $1.0\times10^{19}$ cm$^{-3}$, the fall time is 1.3 ns.

As described above, in the case where the impurity concentration of the barrier layers is set to $2.0\times10^{18}$ cm$^{-3}$ or more, the fall time is 1.6 ns, 1.3 ns or 1.3 ns, showing high-speed responsiveness. Contrary to this, in the case where the impurity concentration of the barrier layers is set to less than $2.0\times10^{18}$ cm$^{-3}$, the fall time sharply increases, reaching 2.6 ns or more. Thus, the impurity concentration of the barrier layers of $2.0\times10^{18}$ cm$^{-3}$ or more is preferred because the response speed can be made higher. In the case where the impurity concentration of the barrier layers is set to $5.0\times10^{18}$ cm$^{-3}$ or more, the fall time can further be reduced, which is more preferred.

According to the semiconductor light-emitting element fabricated as described above, the initial optical power was 1.6 mW at 30 mA. The operating voltage at the time of 30 mA was 2.3 V. The reason for achievement of the thus lowered operating voltage is that an electric current was sufficiently diffused in the p-type AlGaInP current diffusion layer 12 so that the electric current is injected uniformly even into the center of the circular-shaped through hole in the GaP current confinement layer 10a.

Figure 6:
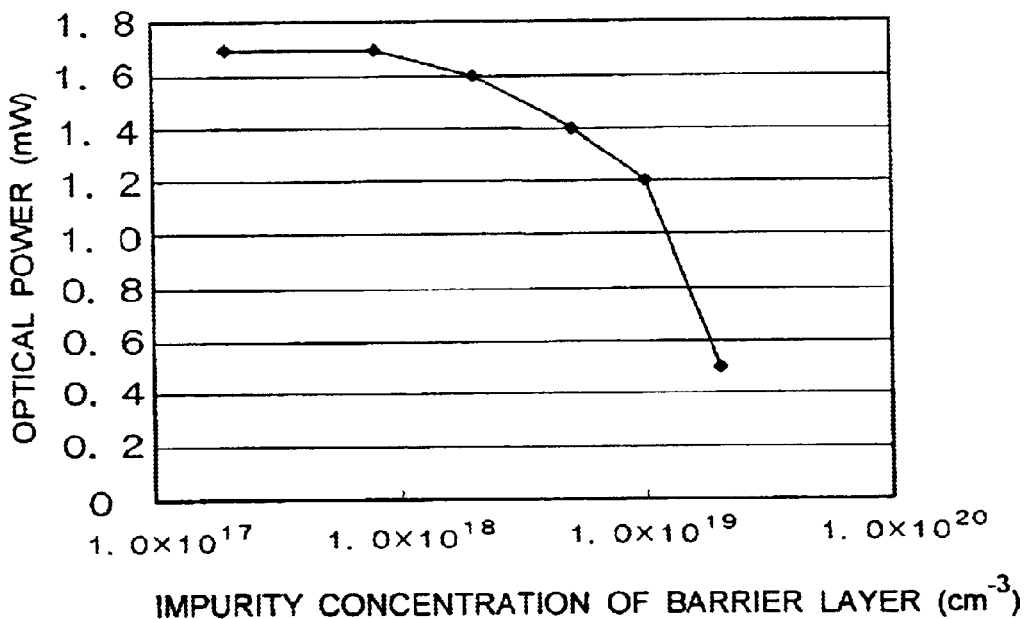
FIG. 6 is a graph showing the relationship between the impurity concentration of the barrier layers and the optical output (optical power)

FIG. 6 shows a graph in which the relationship between the impurity concentration of the barrier layers of the quantum well active layer and the optical power is plotted.

As seen from FIG. 6, when the impurity concentration of the barrier layers exceeds $1.0\times10^{19}$ cm$^{-3}$, impurities in the barrier layers are diffused to the well layer, and the optical power is lowered sharply. Thus, from the viewpoint of preventing a reduction in the optical power due to diffusion of the impurities to the well layer, the impurity concentration of the barrier layers is preferably set to not more than $1.0\times10^{19}$ cm$^{-3}$.

Figure 7:
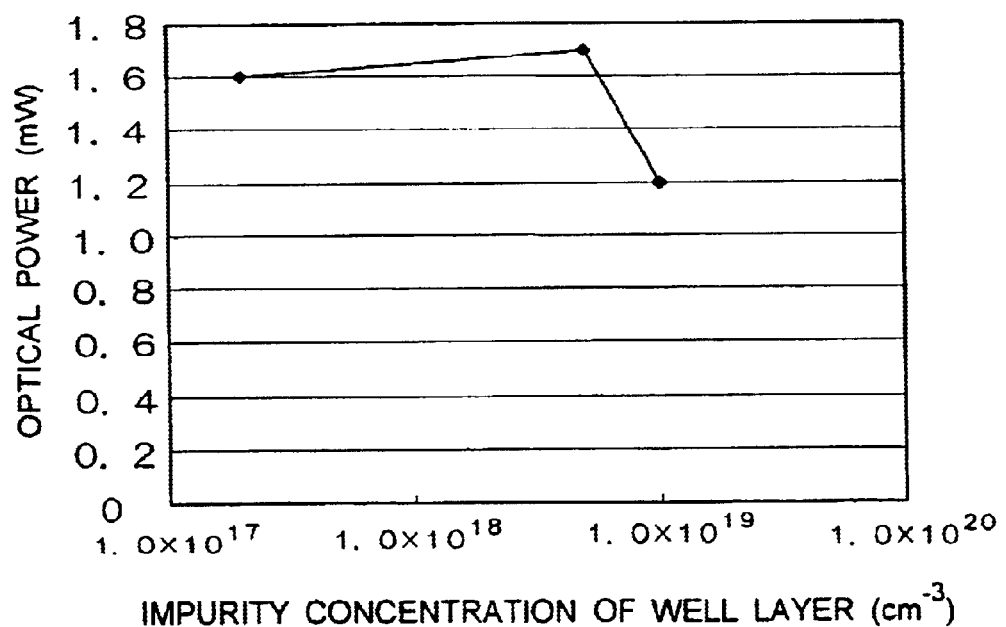
FIG. 7 is a graph showing the relationship between the impurity concentration of the well layer and the optical output (optical power)

FIG. 7 shows a graph in which the relationship between the impurity concentration of the well layer of the quantum well active layer and the optical output is plotted.

As seen from FIG. 7, when the impurity concentration of the well layer is set in the range of 0 cm$^{-3}$–$5\times10^{17}$ cm$^{-3}$, the well layer does not fail to have an impurity concentration lower than that of the barrier layers, and a sharp fall of the optical power is avoided. Therefore, setting of the impurity concentration of the well layer in the above range is preferable.

In Embodiment 1, the semiconductor light-emitting element was produced by the MOCVD method. Alternatively, it may be produced using, for example, an MBE (molecular beam epitaxy) method, a sputtering method or the like.

The composition of the films constituting each of the first and second DBR films and the number of pairs thereof are not limited to the described ones of Embodiment 1.

In Embodiment 1, the single quantum well light-emitting layer may be composed of $Al_yGa_zIn_{1-y-z}P$ ($0 \leq y \leq 1$, $0 \leq z \leq 1$) having a composition ratio other than that mentioned above. That is, the single quantum well light-emitting layer may have one well layer composed of $Al_yGa_zIn_{1-y-z}P$ ($0 \leq y \leq 1$, $0 \leq z \leq 1$), and barrier layers each composed of $Al_yGa_zIn_{1-y-z}P$ ($0 \leq y \leq 1$, $0 \leq z \leq 1$), the barrier layers sandwiching this well layer.

In Embodiment 1, the second DBR film may be composed of $Al_yGa_zIn_{1-y-z}P$ ($0 \leq y \leq 1$, $0 \leq z \leq 1$) having a composition ratio other than that mentioned above.

In Embodiment 1, the current confinement layer may be composed of $Al_yGa_zIn_{1-y-z}P$ ($0 \leq y \leq 1$, $0 \leq z \leq 1$).

In Embodiment 1, the current diffusion layer is composed of $Al_yGa_zIn_{1-y-z}P$ ($0 \leq y \leq 1$, $0 \leq z \leq 1$).

In Embodiment 1, as an impurity, any one of Zn, Mg and Se may be added to the barrier layers. In this case also, the effect of improving the response time can be achieved in the same manner as the case where the barrier layers are doped with Si.

In Embodiment 1, the well layer may be doped with any one of Si, Zn, Mg and Se as an impurity.

The semiconductor light-emitting element of Embodiment 1 may be incorporated into a communication module for use with POFs or a display device, for example.

(Embodiment 2)

Figure 8A:
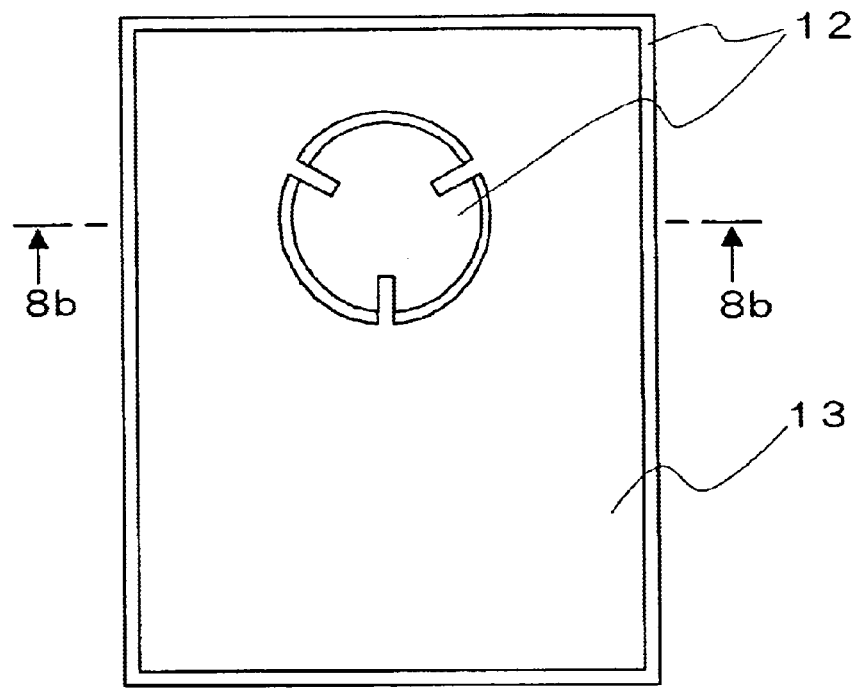
FIG. 8(a) is a top plan view of a semiconductor light-emitting element of Embodiment 2 of the present invention.
Figure 8B:
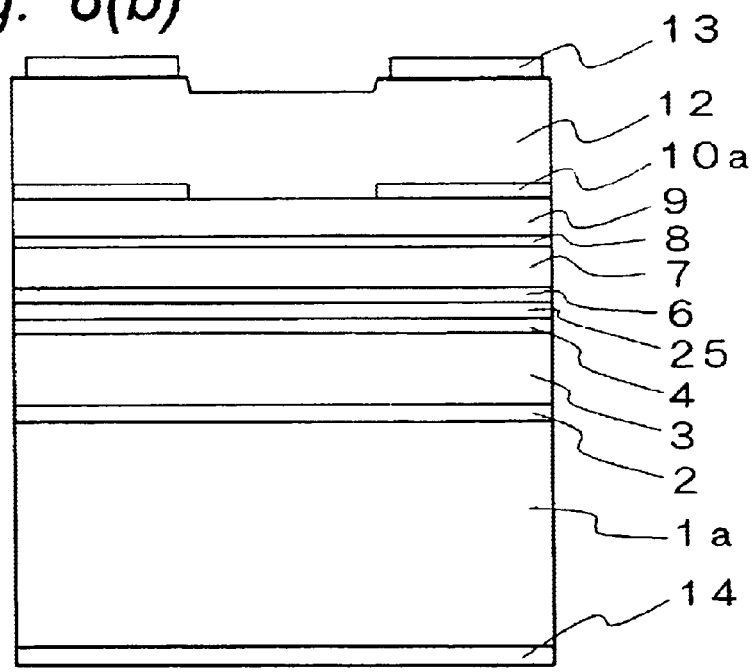
FIG. 8(b) is a cross-sectional view taken along line 8b—8b of FIG. 8(a)
Figure 9:
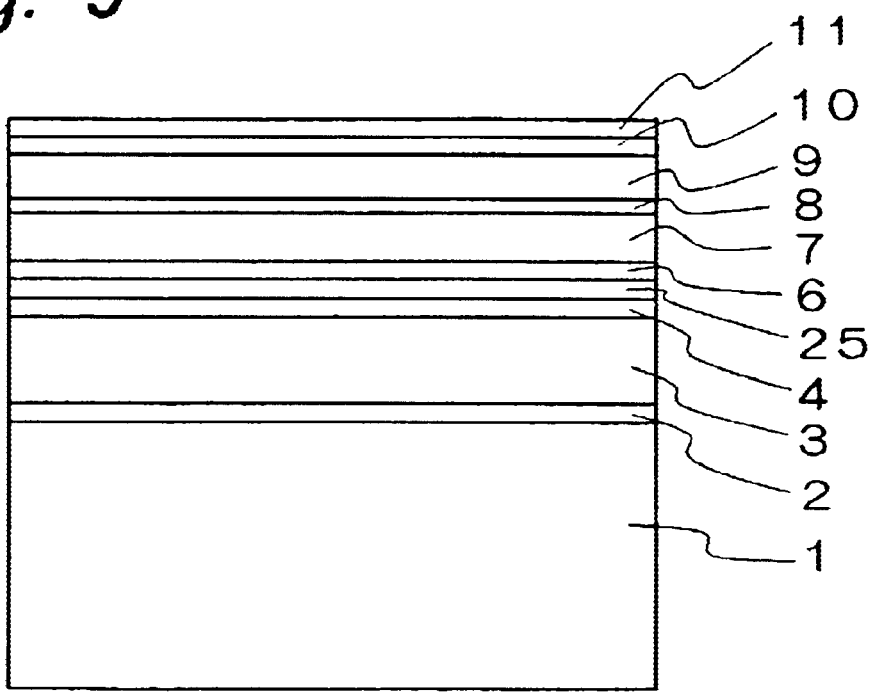
FIG. 9 is a cross-sectional view of the semiconductor light-emitting element of Embodiment 2 in course of production.
Figure 10A:
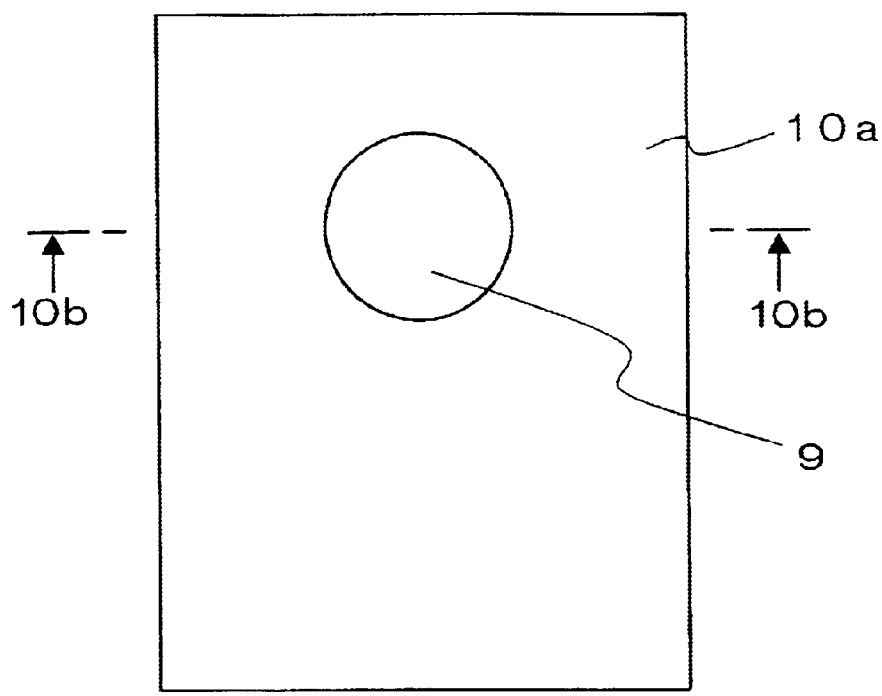
FIG. 10(a) is another top plan view of the semiconductor light-emitting element of Embodiment 2 in course of production.
Figure 10B:
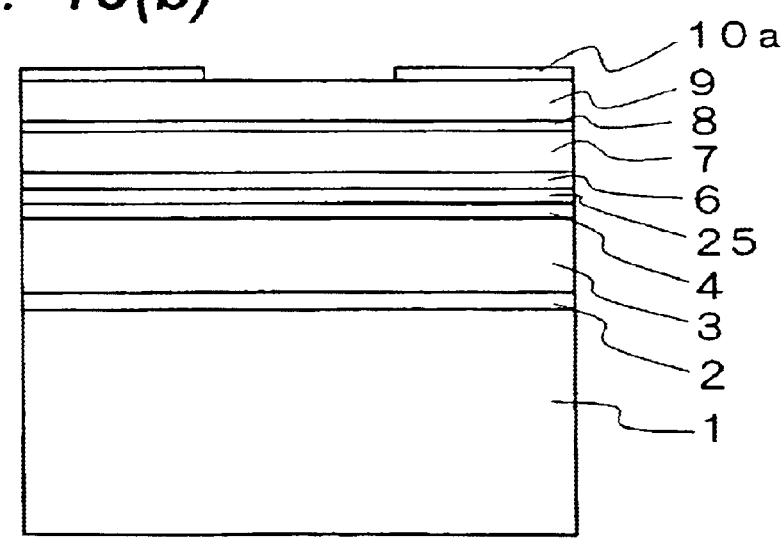
FIG. 10(b) is a cross-sectional view taken along line 10b—10b of FIG. 10(a)

FIG. 8(a) is a top plan view of a resonant cavity-type semiconductor light-emitting element of Embodiment 2, and FIG. 8(b) is a cross-sectional view taken along line 8b—8b of FIG. 8(a). FIG. 9 is a cross-sectional view of the semiconductor light-emitting element in a production process step. FIG. 10(a) is a top plan view of the semiconductor light-emitting element in another production process step, and FIG. 10(b) is a cross-sectional view taken along line 10b—10b of FIG. 10(a).

The semiconductor light-emitting element of Embodiment 2 is of an AlGaInP type, and is produced in the following manner.

First, as shown in FIG. 9, stacked on an n-type GaAs substrate 1 as one example of the semiconductor substrate are an n-type GaAs buffer layer 2, a first DBR film 3 as one example of the first multi-layer reflective film, an n-type $(Al_{0.7}Ga_{0.3})_{0.5}In_{0.5}P$ first cladding layer 4, a multi-quantum well active layer 25 as one example of the quantum well light-emitting layer, a p-type $(Al_{0.7}Ga_{0.3})_{0.5}In_{0.5}P$ second cladding layer 6, a second DBR film 7 as one example of the second multi-layer reflective film, a p-type AlGaInP intermediate layer 8, a p-type GaP etching protective layer 9, an n-type GaP current confinement layer 10, and an undoped GaAs cap layer 11, which are sequentially formed by the MOCVD method. The n-type GaAs substrate 1 has a plane orientation inclined at an angle of 15° relative to a (100) plane in a [011] direction. In Embodiment 2, the thicknesses of the n-type GaAs buffer layer 2, the p-type AlGaInP intermediate layer 8, the p-type GaP etching protective layer 9, the n-type GaP current confinement layer 10 and the GaAs cap layer 11 are set to 1 µm, 0.1 µm, 1 µm, 0.3 µm and 0.01 µm, respectively.

The first DBR film 3 is composed of 30.5 pairs of n-type AlAs and n-type $Al_{0.5}Ga_{0.5}As$, while the second DBR film 7 is composed of 12 pairs of p-type $(Al_{0.2}Ga_{0.8})_{0.5}In_{0.5}P$ and p-type $Al_{0.5}In_{0.5}P$. These first and second DBR films 3, 7 are formed such that the center wavelength of the reflection spectrum is 650 nm. The first and second DBR films 3, 7, spaced from each other by a specified distance, form a resonator. The length of the resonator is adjusted such that the resonance wavelength is also 650 nm. In Embodiment 2, the length of the resonator is set to twice the wavelength. Furthermore, the multi-quantum well active layer 25 is positioned at the loop of a standing wave generated within the resonator formed by the first and second DBR films 3, 7. Also, the light-emitting peak wavelength of the multi-quantum well active layer 25 is set to 650 nm.

Figure 11:
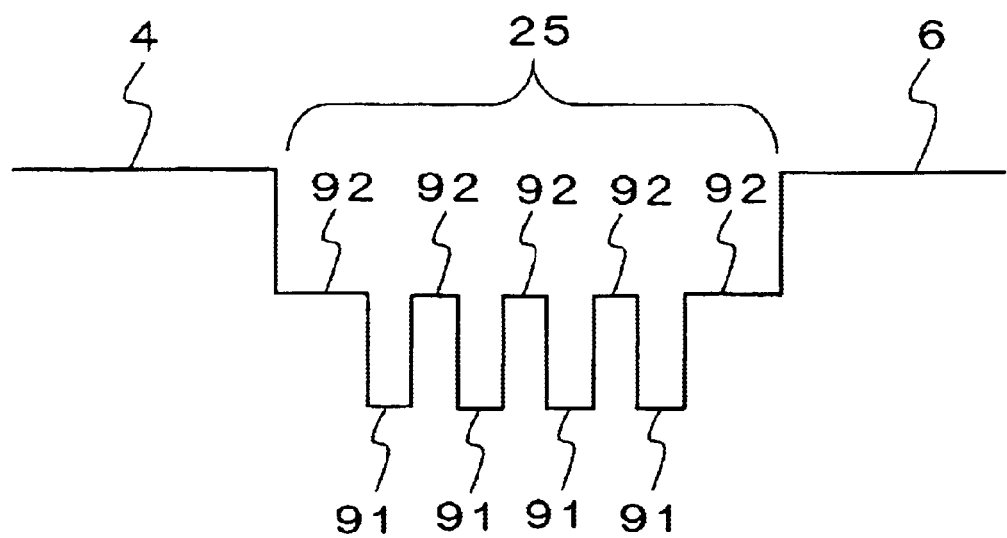
FIG. 11 is a view showing the bandgaps of a multi-quantum well active layer of the semiconductor light-emitting element of Embodiment 2.

The bandgaps present between the n-type $(Al_{0.7}Ga_{0.3})_{0.5}In_{0.5}P$ first cladding layer 4 and the p-type $(Al_{0.7}Ga_{0.3})_{0.5}In_{0.5}P$ second cladding layer 6 is shown in FIG. 11. In FIG. 11, the bandgap energy is higher in an upper part than in a lower part of the figure.

The multi-quantum well active layer 25 has four $Ga_{0.5}In_{0.5}P$ well layers 91, . . . , 91, and five $(Al_{0.5}Ga_{0.5})_{0.5}In_{0.5}P$ barrier layers 92, . . . , 92, with each $Ga_{0.5}In_{0.5}P$ well layer 91 sandwiched between two barrier layers. The $Ga_{0.5}In_{0.5}P$ well layers 91, . . . , 91 are Si-doped, have a thickness of 100 Å and an impurity concentration of $2 \times 10^{17}$ cm$^{-3}$, for example. The $(Al_{0.5}Ga_{0.5})_{0.5}In_{0.5}P$ barrier layers 92, . . . , 92 are also Si-doped, have a thickness of 100 Å between the adjacent well layers and 200 Å between the adjacent well layer and cladding layer, and an impurity concentration of $5 \times 10^{18}$ cm$^{-3}$, for example.

Next, the GaAs cap layer 11 is removed by a sulfuric acid/hydrogen peroxide type etchant, and then a part of the n-type GaP current confinement layer 10 is etched by photolithography and the sulfuric acid/hydrogen peroxide type etchant until the p-type GaP etching protective layer 9 is reached. As a result, an n-type GaP current confinement layer 10a is achieved on the p-type GaP etching protective layer 9, as shown in FIG. 10(a) and FIG. 10(b). This GaP current confinement layer 10a is formed with a circular-shaped through hole having a diameter of 70 µm, and a substance which the through hole is filled with becomes a part of a current path.

Next, as shown in FIG. 8(a) and FIG. 8(b), a p-type AlGaInP current diffusion layer 12 having a thickness of, for example, 7 µm is formed on the GaP etching protective layer 9 and the n-type GaP current confinement layer 10a. After that, AuBe/Au is deposited on the p-type AlGaInP current diffusion layer 12, which is processed by photolithography and an Au etchant to form a surface electrode. Thermal treatment of the surface electrode results in a p-type electrode 13 on the p-type AlGaInP current diffusion layer 12. Then, the n-type GaAs substrate 1 is polished from the side opposite from the side that faces the n-type GaAs buffer layer 2 to obtain an about 280-µm thick GaAs substrate 1a. AuGe/Au is deposited on the polished surface of this GaAs substrate 1a, namely on the surface of the lower side of the GaAs substrate 1a in FIG. 8(b), and then thermally treated to form an n-type electrode 14.

The semiconductor light-emitting element of Embodiment 2 obtained in this manner is different from the semiconductor light-emitting element of Embodiment 1 in that the former has the multi-quantum well active layer 25. That is, while the single quantum well active layer 5 is used as the quantum well light-emitting layer in Embodiment 1, the multi-quantum well active layer 25 is used as the quantum well light-emitting layer in Embodiment 2. Use of the multi-quantum well active layer 25 improved the optical power, and the initial optical power reached 2.2 mW at 30 mA. Needless to say, the semiconductor light-emitting element of Embodiment 2 achieves the same effects as the semiconductor light-emitting element of Embodiment 1.

In Embodiment 2 also, because of the same reason as described in connection with Embodiment 1, the impurity concentration of the barrier layers is preferably set in the range of $2.0 \times 10^{18}$–$1.0 \times 10^{19}$ cm$^{-3}$, more preferably in the range of $5.0 \times 10^{18}$–$1.0 \times 10^{19}$ cm$^{-3}$. Furthermore, because of the same reason as described in connection with Embodiment 1, the impurity concentration of the well layers is preferably set in the range of 0 cm$^{-3}$–$5 \times 10^{17}$ cm$^{-3}$.

In Embodiment 2, the semiconductor light-emitting element was produced by the MOCVD method, and it may be produced using, for example, an MBE (molecular beam epitaxy) method, a sputtering method or the like.

The composition of the films constituting each of the first and second DBR films and the number of pairs thereof are not limited to the described ones of Embodiment 2.

In Embodiment 2, the multi-quantum well light-emitting layer may be composed of $Al_yGa_zIn_{1-y-z}P$ ($0 \leq y \leq 1$, $0 \leq z \leq 1$) having a composition other than that mentioned above. That is, the multi-quantum well light-emitting layer may have well layers each composed of $Al_yGa_zIn_{1-y-z}P$ ($0 \leq y \leq 1$, $0 \leq z \leq 1$), and barrier layers each composed of $Al_yGa_zIn_{1-y-z}P$ ($0 \leq y \leq 1$, $0 \leq z \leq 1$), with each well layer sandwiched between two barrier layers.

In Embodiment 2, the second DBR film may be composed of $Al_yGa_zIn_{1-y-z}P$ ($0 \leq y \leq 1$, $0 \leq z \leq 1$) having a composition other than that mentioned above.

In Embodiment 2, the current confinement layer may be composed of $Al_yGa_zIn_{1-y-z}P$ ($0 \leq y \leq 1$, $0 \leq z \leq 1$) having a composition other than that mentioned above.

In Embodiment 2, the current diffusion layer is composed of $Al_yGa_zIn_{1-y-z}P$ ($0 \leq y \leq 1$, $0 \leq z \leq 1$).

In Embodiment 2, each of the barrier layers and/or the well layers may be doped with one of Zn, Mg and Se. In this case also, the effect of improving the response time can be achieved similarly to the case where Si is used.

The semiconductor light-emitting element of Embodiment 2 may be incorporated into a communication module for use with POFs or a display device, for example.

The present invention is applicable to a resonant-cavity type LED.

As is apparent from the above description, in the semiconductor light-emitting element of the present invention, because the impurity concentration of the barrier layers is higher than that of the well layer(s), injected carriers are easily recombined in the barrier layers. This reduces the fall time when the response signal is off. As a result, high-speed responsiveness can be enhanced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light-emitting element comprising:
    a first multi-layer reflective film supported by a semiconductor substrate and a second multi-layer reflective film formed above the first multi-layer reflective film at a specified distance from the first multi-layer reflective film;
    the first and second reflective films forming a resonator within which a standing wave is generated; and
    a quantum well light-emitting layer formed at a loop of the standing wave within the resonator;
    the quantum well light-emitting layer having at least one well layer and barrier layers that sandwich the at least one well layer therebetween;
    the barrier layers having an impurity concentration higher than an impurity concentration of the well layer.

2. The semiconductor light-emitting element according to claim 1, wherein the impurity concentration of the barrier layers is in a range of $2 \times 10^{18}$ cm$^{-3}$–$1 \times 10^{19}$ cm$^{-3}$.

3. The semiconductor light-emitting element according to claim 2, wherein the impurity concentration of the barrier layers is in a range of $5 \times 10^{18}$ cm$^{-3}$–$1 \times 10^{19}$ cm$^{-3}$.

4. The semiconductor light-emitting element according to claim 2, wherein the impurity concentration of the well layer is $5 \times 10^{17}$ cm$^{-3}$ or less.

5. The semiconductor light-emitting element according to claim 1, wherein the quantum well light-emitting layer is composed of $Al_yGa_zIn_{1-y-z}P$ ($0 \leq y \leq 1$, $0 \leq z \leq 1$).

6. The semiconductor light-emitting element according to claim 1, wherein the second multi-layer reflective film is composed of $Al_yGa_zIn_{1-y-z}P$ ($0 \leq y \leq 1$, $0 \leq z \leq 1$).

7. The semiconductor light-emitting element according to claim 1, comprising a current confinement layer formed on the second multi-layer reflective film.

8. The semiconductor light-emitting element according to claim 7, wherein the current confinement layer is composed of $Al_yGa_zIn_{1-y-z}P$ ($0 \leq y \leq 1$, $0 \leq z \leq 1$).

9. The semiconductor light-emitting element according to claim 7, comprising a current diffusion layer formed on the current confinement layer.

10. The semiconductor light-emitting element according to claim 9, wherein the current diffusion layer is composed of $Al_yGa_zIn_{1-y-z}P$ ($0 \leq y \leq 1$, $0 \leq z \leq 1$).

11. The semiconductor light-emitting element according to claim 1, wherein the at least one well layer and/or the barrier layers are doped with any one of Si, Zn, Mg and Se.

* * * * *